United States Patent
Sun et al.

(10) Patent No.: US 10,285,265 B2
(45) Date of Patent: May 7, 2019

(54) SUPPORT BACK PLATE AND CURVED DISPLAY DEVICE

(71) Applicant: BOE TECHNOLOGY GROUP CO., LTD., Beijing (CN)

(72) Inventors: Li Sun, Beijing (CN); Wei Cui, Beijing (CN); Xiaohu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 366 days.

(21) Appl. No.: 15/155,668

(22) Filed: May 16, 2016

(65) Prior Publication Data

US 2017/0094785 A1   Mar. 30, 2017

(30) Foreign Application Priority Data

Sep. 29, 2015   (CN) .......................... 2015 1 0634079

(51) Int. Cl.
*H05K 1/02*   (2006.01)
*H01L 51/52*   (2006.01)

(52) U.S. Cl.
CPC ....... *H05K 1/0281* (2013.01); *H01L 51/5237* (2013.01); *H01L 51/5253* (2013.01); *H01L 51/524* (2013.01); *H01L 2251/5338* (2013.01); *H05K 2201/09018* (2013.01); *H05K 2201/10106* (2013.01); *H05K 2201/10128* (2013.01)

(58) Field of Classification Search
CPC ....... H05K 1/0128; H05K 2201/09018; H05K 2201/09036; H05K 2201/09045; H05K 2201/10106; H05K 2201/10128; H01L 51/5237; H01L 51/5253; H01L 51/5256

USPC ...................... 428/1.1, 1.6; 349/58, 158, 162
See application file for complete search history.

(56) References Cited

U.S. PATENT DOCUMENTS

| | | | |
|---|---|---|---|
| 2009/0161048 A1 | 6/2009 | Satake et al. | |
| 2015/0036077 A1 | 2/2015 | Lee et al. | |
| 2015/0208529 A1 | 7/2015 | Sakong | |
| 2016/0095206 A1* | 3/2016 | Lai ....................... | H05K 1/0271 362/97.1 |

FOREIGN PATENT DOCUMENTS

| | | |
|---|---|---|
| CN | 1987611 A | 6/2007 |
| CN | 101344651 A | 1/2009 |
| CN | 101464582 A | 6/2009 |
| CN | 101915999 A | 12/2010 |
| CN | 202510946 U | 10/2012 |
| CN | 103424913 A | 12/2013 |

(Continued)

OTHER PUBLICATIONS

First Chinese Office Action dated May 31, 2017.
Second Chinese Office Action dated Mar. 5, 2018.

*Primary Examiner* — Ruiyun Zhang
(74) *Attorney, Agent, or Firm* — Dilworth & Barrese, LLP.; Michael J. Musella, Esq.

(57) ABSTRACT

A support back plate and a curved display device are disclosed. The support back plate including a first end and a second end in opposition to each other, wherein the support back plate is bent into a shape of an arc face; and a thickness in the middle region of the support back plate is greater than that at the first end and the second end. The above-mentioned support back plate is used in a curved display device to solve the problem of a usual curved display device with more thickness and weight.

18 Claims, 4 Drawing Sheets

(56) References Cited

FOREIGN PATENT DOCUMENTS

| | | |
|---|---|---|
| CN | 103672614 A | 3/2014 |
| CN | 104332108 A | 2/2015 |
| CN | 104347009 A | 2/2015 |
| CN | 104793700 A | 7/2015 |
| CN | 204965932 U | 1/2016 |
| EP | 2730968 A2 | 8/2013 |
| KR | 20150069802 A | 6/2015 |
| WO | 2012081504 A1 | 6/2012 |

* cited by examiner

SUPPORT BACK PLATE AND CURVED DISPLAY DEVICE

TECHNICAL FIELD

At least one embodiment of the present disclosure relates to a support back plate and a curved display device.

BACKGROUND

With the unceasing development of display technology, curved display devices have become one of the research hotspots of the display technology field in recent years. Curved display devices have a certain radian, and can provide viewers with better visual experience, and reasons for this are as follows. On one hand, the human eyeball is protrusive to have a radian, and the distance from an eye to a screen can be assured of being equal by the radian of a curved display device. On the other hand, existence of the radian allows either end of the screen to be bent toward a viewer, so that a viewing angle at either end of the curved display device is substantially the same as that at the center.

SUMMARY

At least one embodiment of the present disclosure provides a support back plate and a curved display device to decrease thickness and weight of a curved display device on the premise that the curved display device is provided with a needed curvature.

At least one embodiment of the present disclosure provides a support back plate comprising a first end and a second end at edges in opposition to each other, wherein the support back plate is bent into a shape of an arc face; and a thickness in the middle region of the support back plate is greater than that at the first end and the second end.

At least one embodiment of the present disclosure provides a curved display device including the support back plate provided by the embodiments of the present disclosure and a display panel, wherein the display panel is disposed on an inner side of the support back plate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE NUMERALS 10-support back plate; L1, L2-two straight sides; L0-central line; MN-sectional line; 11-main support back plate; 12-sub-support back plate; S1-inner side (inner face); S2-outer side (outer face); 20-display panel; 21-packaging structure; 22-light-emitting structure; 23-base substrate; 100-curved display device.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

Figure 1:
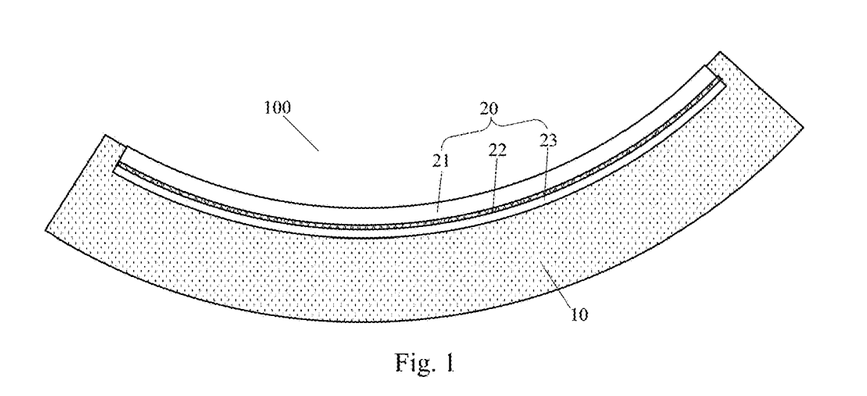
FIG. 1 is a sectional view illustrating a support back plate.

One of comparatively frequently used methods for manufacturing curved display devices in general is that, as illustrated in FIG. 1, a flat display panel 20 accomplished by manufacture is placed in a support back plate 10 that is curved and has a uniform thickness, and a support force is exerted on the flat display panel 20 by the support back plate 10, so as to counteract a resilience force generated when the display panel 20 is curved. Thus, the display panel 20 is kept in a curved shape, and has a desired curvature. Because a resilience force of the display panel 20 is comparable to a support force that can be offered by the support back plate 10, and the support force that can be offered by the support back plate 10 is directly proportional to the thickness of its own, thickness of the support back plate 10 will be relatively great when resilience force of the display panel 20 is relatively large. This causes a constituted curved display device 100 to be thicker and heavier, and it does not comply with the market demands for lightness and thinness.

It is to be noted that, in embodiments of the present disclosure, the so-called "an outer side of a main support back plate" etc. refer to a raised side of the main support back plate after being bent; and the so-called "an inner side of a main support back plate" etc. refer to a recessed side of the main support back plate after being bent. Likewise, the so-called "an inner side of a support back plate" etc. refer to a recessed side of the support back plate after being bent. The so-called "an outer side of a support back plate" etc. refer to a raised side of the support back plate after being bent.

First Embodiment

Figure 2A:
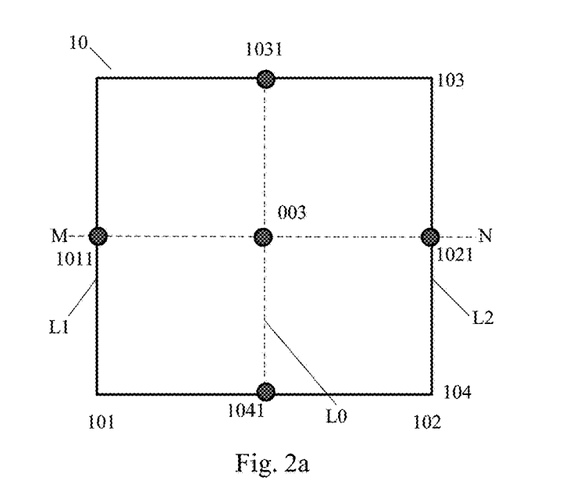
FIG. 2a is a plan view illustrating a support back plate provided by the first embodiment of the present disclosure.

According to the present embodiment, there is provided a support back plate. As illustrated in FIG. 2a, which is a plan view illustrating a support back plate 10, the support back plate 10 includes two opposite sides L1 and L2, a thickness in the middle region of the support back plate 10 is greater than that at either end where the two sides L1 and L2 are located; the support back plate 10 is bent into a shape of an arc face, namely, cross section of the support back plate 10 taken along a sectional line MN is in an arc shape. L1 and L2 can be straight sides, and L1 and L2 can be in parallel to each other.

As illustrated in FIG. 2a, the support back plate 10 is bent into a shape of an arc face, and includes a first end 101 and a second end 102 in opposition to each other, which are located at edges of the support back plate 10, and a thickness at the location of a center 003 of the support back plate 10 is greater than that at the first end 101 and the second end 102. For example, the first end 101 and the second end 102 are located at different side of the center 003. The first end 101 and the second end 102 refer to, such as, two opposite sides, and further, for example, they refer to two opposite straight sides. The center 003 refers to, such as, a central line or any point on the central line on the support back plate 10, the distance from which to the first end 101 is equal to the distance from which to the second end 102. In addition, the first end 101 and the second end 102, for example, can also refer to two opposite points at edges of the support back plate, such as, 1011 and 1021 in FIGS. 2a, or, 1031 and 1041 in FIG. 2a. For example, the center 003 can also refer to a midpoint of the shortest connecting line for connecting the first end 101 and the second end 102 on the support back plate 10.

Figure 2B:
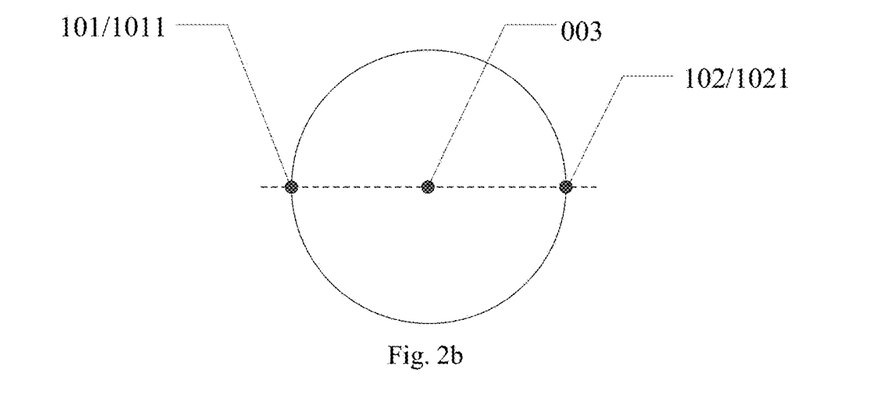
FIG. 2b is a plan view illustrating another support back plate provided by the first embodiment of the disclosure.
Figure 2C:
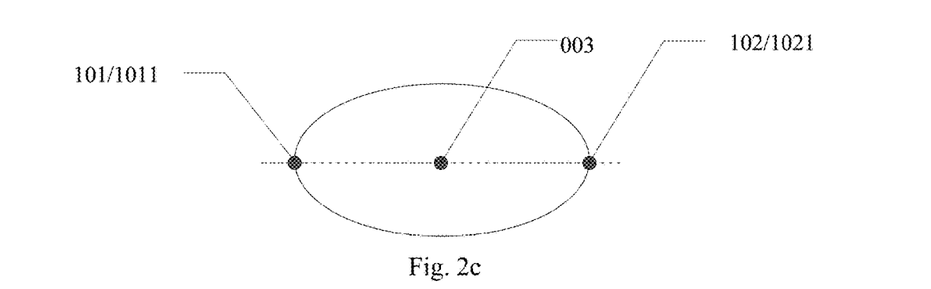
FIG. 2c is a plan view illustrating another support back plate provided by the first embodiment of the disclosure.

It is to be noted that, the shape of the edge of a plan view of the support back plate 10 is not limited to a rectangle as illustrated in FIG. 2a, and can also be other polygon. It can also be a circle as illustrated in FIG. 2b, an ellipse as illustrated in FIG. 2c or other shapes, and limitations are not imposed thereto. For example, when the shape of the edge of a plan view of the support back plate 10 is a circle, as illustrated in FIG. 2b, the first end 101 and the second end 102 can refer to, such as two end points (1011 and 1021) of a diameter of the circle. The center 003 can refer to, such as the center of the circle. For example, when the shape of the edge of a plan view of the support back plate 10 is an ellipse, as illustrated in FIG. 2c, the first end 101 and the second end 102 can refer to, such as two end points (1011 and 1021) of a long axis of the ellipse, and can also be two end points of a short axis. The center 003 can refer to, such as the center of the ellipse.

The middle region in embodiments of the present disclosure refers to, such as one point, one line, or a certain area.

As for the support back plate 10 bent into the shape of an arc face, a support force that can be offered in the middle region or at the center is greater than a support force that can be offered at its edges (e.g. two ends where two sides L1 and L2 are located, which are briefly called as two ends below). That is, the biggest support force that can be offered by the support back plate depends on its thickness in the middle region or at the center. Regarding the support back plate 10 provided by the embodiment, its thickness in the middle region is greater than that at either end (thickness at the center is greater than that at the first end and the second end). As compared with a support back plate with even thickness in general technology, on the premise that a support force required to be provided (i.e. the biggest supporting force) is the same, a thickness of a middle region of the support back plate 10 in the embodiment is the same as that of a middle region of a support back plate in general technology. Or, the thickness at the center of the support back plate in the embodiment is the same as that at the center of a support back plate in general technology, and the thickness at either end of the support back plate 10 in the embodiment is less than that at either end of a support back plate in general technology. Thus, thickness and weight of the support back plate 10 in the embodiment are relatively small, and this is benefit to reduce thickness and weight of a curved display device to which the support back plate 10 is applied.

Second Embodiment

Figure 3A:
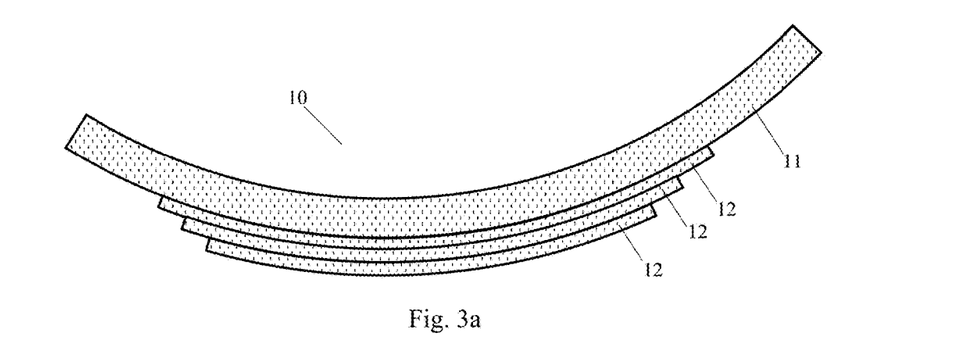
FIG. 3a is a sectional view illustrating a support back plate provided by the second embodiment of the disclosure, as taken along a sectional line MN.

On the basis of the first embodiment, referring to FIG. 2a and FIG. 3a, which is a view illustrating a cross section of the back plate illustrated in FIG. 2a taken along a sectional line MN, the thickness of the support back plate 10 provided by the embodiment is reduced in a stepwise manner from a central line L0 parallel to two sides L1 and L2 to the two sides L1 and L2.

In one example, the support back plate 10 can include a main support back plate 11 and a sub-support back plate 12, which is laminated on an outer side of the main support back plate 11, and the area of which is smaller than that of the main support back plate 11, and two ends of the support back plate 10 where two sides L1 and L2 are located have a stepwise shape. Thus, on the premise that a support force required to be provided is met, the thickness of the support back plate 10 is reduced in a stepwise manner from the middle region to either end, and weight of the support back plate 10 is decreased.

For example, the support back plate 10 includes a plurality of sub-support back plates 12, which are sequentially laminated on the outer side of the main support back plate 11, and areas of which decrease gradually in a direction away from the main support back plate 11. Further, sizes of sub-support back plates 12 in a direction perpendicular to two sides L1 and L2 decrease gradually. Thus, a structure in a multilevel step can be formed at two sides of the support back plates 10 where two sides L1 and L2 are located, and this makes thickness of the support back plate 10 be transited from an end to the middle region or to the center in a multilevel step form. Consequently, on the premise that a support force required to be provided is met, the thickness of the support back plate 10 is further reduced, and weight of the support back plate 10 is further lightened.

Figure 3B:
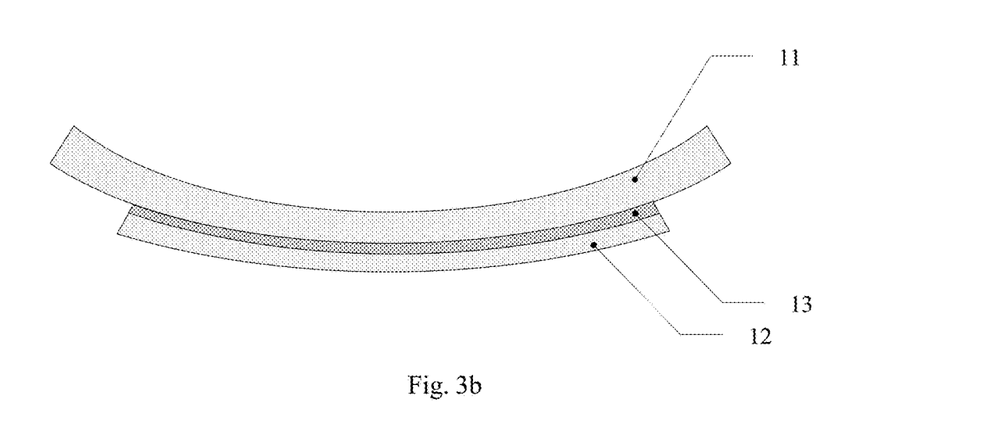
FIG. 3b is a schematic view illustrating an adhesive connection between a main support back plate and a sub-support back plate adjacent to the main support back plate provided by the second embodiment of the disclosure.
Figure 3C:
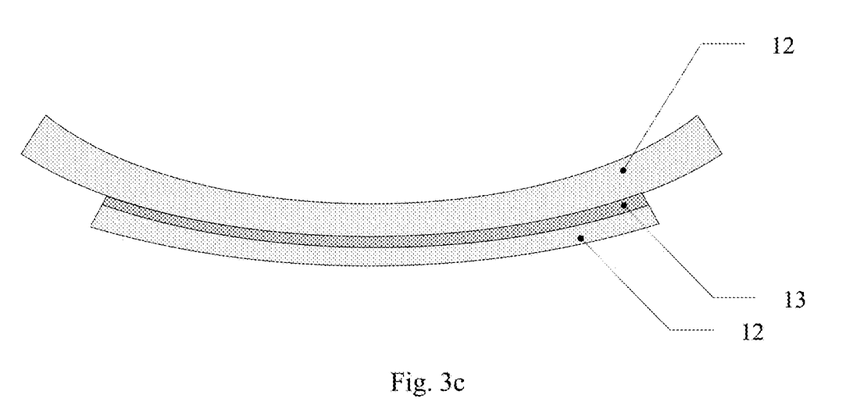
FIG. 3c is a schematic view illustrating an adhesive connection between sub-support back plates provided by the second embodiment of the disclosure.

For example, as illustrated in FIG. 3b, the main support back plate 11 and the sub-support back plate 12 adjacent to the main support back plate can be bonded by an adhesive, so as to define the relative position between the main support back plate 11 and the sub-support back plate 12 adjacent to it. As illustrated in FIG. 3c, two adjacent sub-support back plates 12 can also be bonded by an adhesive, so as to define the relative position between the two adjacent sub-support back plates 12.

Figure 3D:
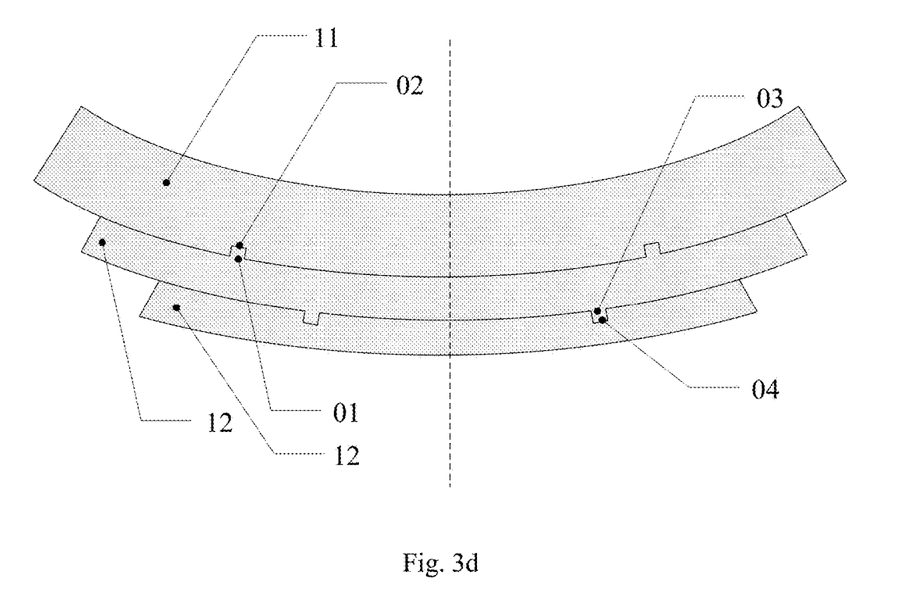
FIG. 3d is a schematic view illustrating protrusions and depressions in a support back plate provided by the second embodiment of the disclosure.

For example, in order to further define the relative position between the main support back plate 11 and the sub-support back plate 12 adjacent to it and to increase the mechanical strength of the support back plate 10, it is possible that as for two faces of the main support back plate 11 and the sub-support back plate 12 adjacent to it that are in contact, a protrusion is provided on one of them, and a depression is provided on the other one. The protrusion and the depression match with each other, so as to define the relative position between the main support back plate 11 and the sub-support back plate 12 adjacent to it. Likewise, in order to further define the relative position between two adjacent sub-support back plates 12 and to increase the mechanical strength of the support back plate 10, it is possible that as for two faces of the two adjacent sub-support back plates 12 that are in contact, a protrusion is provided on one of them, and a depression is provided on the other one. The protrusion and the depression match with each other, so as to define the relative position between the two adjacent sub-support back plates 12. FIG. 3d shows the case that, as for two faces of a main support back plate 11 and a sub-support back plate 12 adjacent to it that are in contact, a protrusion 01 is provided on one of them, and a depression 02 is provided on the other one, and as for two faces of two adjacent sub-support back plates 12 that are in contact, a protrusion 03 is provided on one of them, and a depression 04 is provided on the other one.

For example, in order that symmetric supporting forces can be offered by two ends of the support back plate 10 and demands for manufacturing a curved display device are better met, a central line of the main support back plate 11 parallel to two sides L1 and L2 can coincide with a central line of each of sub-support back plates 12 parallel to two sides L1 and L2. Thus, thickness of the support back plate 10 is decreased from the central line L0 to two sides L1 and L2 with the same extent, and the support back plate 10 appears to be an axially symmetric structure with the central line L0 as a symmetric axis. For example, as illustrated in FIG. 3d, the center of the main support back plate and the center of each of the sub-support back plates can be in a straight line.

For example, in the support back plate 10 provided by an example of the present embodiment, in a direction away from the main support back plate 11, strength of material for sub-support back plates 12 can increase gradually. Thus, as compared with a support back plate formed by adopting a material in general technology, in the event that a support force required to be provided is the same, thickness of the support back plate 10 in the middle region and/or at the center in this example can be decreased. Consequently, thickness and weight of the support back plate 10 is further decreased. Material for sub-support back plate 12 can be chosen according to requirements on the strength of sub-support back plates 12. In addition, in the event that materials for the main support back plate 11 and sub-support back plates 12 are chosen appropriately, the following situation is achievable: a required support force can be offered by merely providing one sub-support back plate 12 on the outer side of the main support back plate 11, and thus thickness and weight of the support back plate 10 are further decreased.

For example, thickness of the main support back plate 11 and each of the sub-support back plates 12 can be designed based on a support force required to be offered. Optionally, thicknesses of the main support back plate 11 and the sub-support back plates 12 can each be greater than or equal to 0.5 mm, so that on the premise of decreasing the thickness at an end of the support back plate 10, a sufficient support force is offered to a display panel of the curved display device.

Figure 5:
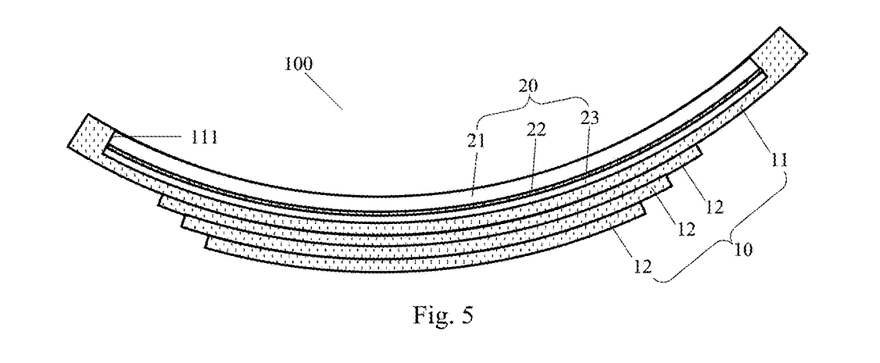
FIG. 5 is a sectional view illustrating a curved display device provided by the fourth embodiment of the disclosure.

For example, as illustrated in FIG. 5, in an example of the embodiment, a groove can be provided on an inner side of the support back plate 10, and for example, a groove is provided on an inner side of the main support back plate 11. A display panel of the curved display device can be embedded within the groove, so as to be fixed to the support back plate 10. In the case of providing the groove, the first end and the second end can be located at edges of the groove of the support back plate.

For example, according to the support back plate 10 provided by an example of the embodiment, its material can be epoxy resin, glass fiber reinforced plastic, metal, polymer film, ceramic, carbon fiber or the like, and limitations are not imposed thereto.

For example, in order to further decrease thickness and weight of the support back plate 10, on the premise that the support force offered by the support back plate 10 is assured of meeting requirements, it is also possible that in the support back plate 10, the thickness at other two ends than the two ends where two sides L1 and L2 are located is smaller than that in the middle zone. Namely, the support back plate 10 includes four sides that are pairwise opposite (opposite sides in a group among which are L1 and L2), and the thickness of the support back plate 10 in the middle region is greater than thicknesses at four ends where four sides are located. As for the support back plate 10 in the embodiment, which has such a structure that multiple back plates (including one main support back plate 11 and at least one sub-support back plate 12) are laminated, it is possible that in a direction advancing toward the outer side from the inside of the support back plate 10, sizes of the back plates in a direction perpendicular to two sides L1 and L2 decrease gradually, and sizes of the back plates in a direction parallel to the two sides L1 and L2 decrease gradually as well. For example, a plan view of an outer side of the support back plate 10 is illustrated as such a pattern that multiple rectangular boxes are nested. Thus, thickness of the support back plate 10 can be reduced in a stepwise manner from the middle region to each of the four ends, and effects of further decreasing thickness and weight of the support back plate 10 is achieved.

For example, as illustrated in FIGS. 2a to 2c, the support back plate includes a third end 103 and a fourth end 104 in opposition to each other, which are located at edges of the support back plate, the first end 101, the second end 102, the third end 103 and the fourth end 104 do not coincide with one another, and the thickness in the middle region (at the center) of the support back plate is greater than thicknesses at the third end and at the fourth end.

With regard to the third end 103 and the fourth end 104, can refer to descriptions of the first end 101 and the second end 102, and details are omitted here.

Third Embodiment

Figure 4:
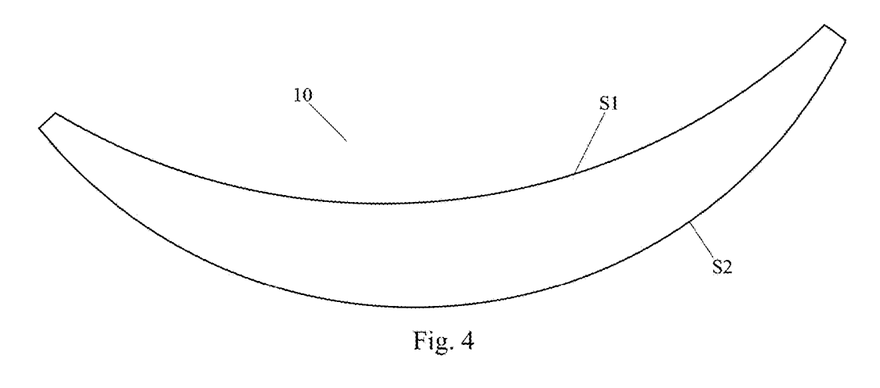
FIG. 4 is a sectional view illustrating a support back plate provided by the third embodiment of the disclosure, as taken along a sectional line MN.

On the basis of the first embodiment, referring to FIG. 2a and FIG. 4, which is a view illustrating a cross section of the back plate illustrated in FIG. 2a taken along a sectional line MN, thickness of the support back plate 10 provided by the embodiment is reduced gradually from a central line L0 parallel to two sides L1 and L2 to the two sides L1 and L2.

For example, the support back plate 10 can be in an integral structure, both an outer side S2 and an inner side S1 of the support back plate 10 are of an arc face, and a curvature of the outer side S2 is greater than that of the inner side S1. Thus, on the premise that a support force required to be offered is met, the thickness of the support back plate 10 is reduced gradually from either end to the middle, and weight of the support back plate 10 is reduced. Because the support back plate 10 is in an integral structure, the mechanical strength of its own is stronger.

Figure 6:
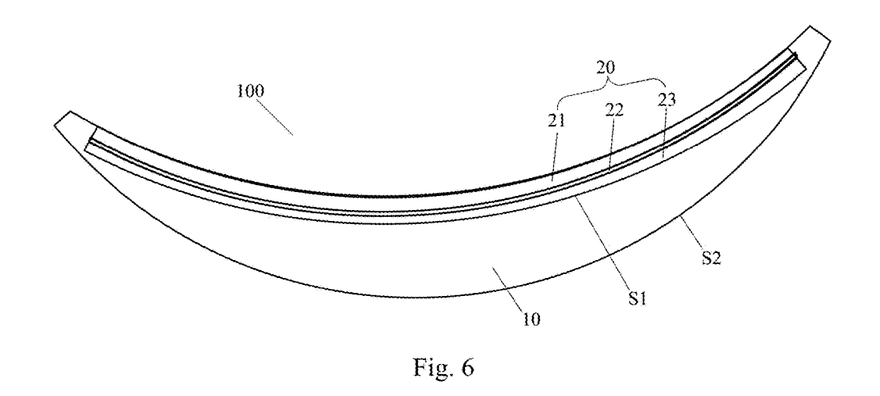
FIG. 6 is another sectional view illustrating a curved display device provided by the fourth embodiment of the disclosure.

For example, as illustrated in FIG. 6, in an example of the embodiment, a groove can be provided on an inner side of the support back plate 10, and a display panel of the curved display device can be embedded within the groove, so as to be fixed to the support back plate 10.

For example, with respect to the support back plate 10 provided by an example of the embodiment, its material can be epoxy resin, glass fiber reinforced plastic, metal, polymer film, ceramic, carbon fiber or the like, and limitations are not imposed thereto.

For example, in order to further decrease thickness and weight of a support back plate 10, on the premise that a support force offered by the support back plate 10 is assured of meeting requirements, it is also possible that in the support back plate 10, the thickness at other two ends than the two ends where two sides L1 and L2 are located is smaller than that in the middle zone. Namely, the support back plate 10 includes four sides that are pairwise opposite (opposite sides in a group among which are L1 and L2), and the thickness of the support back plate 10 in the middle region is greater than thicknesses at four ends where four sides are located. For example, thickness of a support back plate 10 can be reduced gradually from the middle region to each of four ends.

Fourth Embodiment

As illustrated in FIG. 5 and FIG. 6, according to the present embodiment, there is provided a curved display device 100, which includes a support back plate 10 being any one of the support back plates as stated in the first to third embodiments and a display panel 21. A curved display device 100 as illustrated in FIG. 5 adopts a support back plate as stated in the second embodiment, a curved display device 100 as illustrated in FIG. 6 adopts a support back plate as stated in the third embodiment, and the display panel 20 is disposed on an inner side of the support back plate 10.

With respect to the curved display device 100 provided by the present embodiment, its support back plate 10 is any one of the support back plates as stated in the first embodiment to the third embodiment. As can be seen from descriptions of the first embodiment to the third embodiment, in the event that a support force required to be offered by a support back plate is the same, the thickness in the middle region or at the center of a support back plate 10 in the first embodiment to the third embodiment is the same as that in the middle region of a support back plate with even thickness, and thickness at either end of the support back plate 10 in the first embodiment to the third embodiment is smaller than that at either end of the support back plate with even thickness, so that thickness of the curved display device 100 is reduced, and its weight is lightened.

Before a support back plate 10 is fixed together with a display panel 20, the original curvature of the support back plate 10 is preferably larger than the curvature needed by the curved display device 100. The reason is that, when the display panel 20 is bent and fixed to the support back plate 10, the display panel 20 will exert a certain resilience force on the support back plate 10, and a support force provided by the support back plate 10 to the display panel 20 is counteracted partially by the resilience force, so that the curvature of the support back plate 10 is decreased somewhat. In view of this, by means of setting the original curvature of the support back plate 10 to be greater than the curvature needed by the curved display device, it is possible that after the support back plate 10 and the display panel 20 are fixed together, the curvature of the constituted curved display device 100 is closer to or equal to the curvature needed by the curved display device 100.

It is to be noted that, the curvature of the support back plate 10 can be attained by setting thickness in each region of the support back plate 10. For example, as for the support back plate 10 in the second embodiment, the thickness in each region of the support back plate 10 can be adjusted by means of increasing the number of sub-support back plates 12, increasing the area of the sub-support back plate 12, increasing the thickness of the main support back plate 11 and/or the sub-support back plate 12, or the like, and in turn, the curvature of the support back plate 10 is increased. On the contrary, the thickness in each region of the support back plate 10 can be adjusted by means of decreasing the number of sub-support back plates 12, decreasing the area of a sub-support back plate 12, decreasing the thickness of the main support back plate 11 and/or the sub-support back plate 12, or the like, and in turn, the curvature of the support back plate 10 is decreased.

For example, the support back plate 10 and the display panel 20 can be fixed together by adhering, inlaying, magnetic absorption, vacuum absorption or the like. As for the fixing mode of adhering, a double-sided adhesive tape can be provided between the support back plate 10 and the display panel 20 to adhere the two together. As for the fixing mode of inlaying, a groove can be provided on an inner side of the support back plate 10, and the display panel 20 is disposed within the groove, thereby achieving a purpose of fixing. As for the fixing mode of magnetic absorption, a magnet structure can be provided on the support back plate 10, and a metal layer with ferromagnetic properties is provided on the display panel 20, so that the support back plate 10 and the display panel 20 are fixed together with aid of an absorbing action between the magnetic structure and the metal layer. As for the fixing mode of vacuum absorption, a number of structures like vacuum suckers can be provided on the support back plate 10, so that the display panel 20 is absorbed and fixed onto the support back plate 10 by the vacuum suckers.

For example, in the curved display device 100 provided by the present embodiment, the type of the display panel 20 can be a liquid crystal type, an OLED (organic light-emitting diode) type, an electronic paper type or the like.

As flexibility of an OLED display panel is better than that of a display panel of other type, an OLED display panel can be chosen as the display panel 20, and its structure, as illustrated in FIG. 5 and FIG. 6, can include a light-emitting structure 22, a base substrate 23 and a packaging structure 21. For example, the light-emitting structure 22 can be an organic electroluminescent structure, and mainly includes two electrode layers, and an organic electroluminescent material sandwiched between the two electrode layers; a closed, protective space is formed by the base substrate 23 and the packaging structure 21, and the light-emitting structure 22 is disposed within the closed, protective space, so as to avoid such a phenomenon that it is corroded by external water and oxygen, and thus, it suffers degradation and malfunction, and does not emit light any longer. The base substrate 23 can be a substrate on which an active driving circuit is provided, so as to drive the light-emitting structure 22 to give off light. The packaging structure 21 can include an organic adhesive film layer that covers the light-emitting structure 22 and has a feature of blocking water and oxygen, and a hard film layer that covers the organic adhesive film layer and has protective property, such as, a glass, a metal foil, a polymer thick film, or the like. The packaging structure 21 can also be a packaging structure formed in such a way that, a circle of dam is produced around the light-emitting structure 22, a liquid filler that has a feature of blocking water and oxygen (e.g. an organic polymer monomer) is then injected inside the dam, after that, it is covered by a hard film layer having protective property, such as a glass, a metal foil, a polymer thick film, or the like, and next, the liquid filler is solidified by means of resting (standing), ultraviolet exposure, heating or the like. It is to be noted that, the OLED display panel is not limited to the structure as given above, and components included in the given structure is not limited to the illustrative materials, either. The display panel in embodiments of the present disclosure is not limited to OLED display panel, either.

For example, the curved display device 100 provided by the embodiment is suitable for televisions, displays, movie screens, cell phones, watches, tablet computers, notebook computers, digital photo frames, navigators or any other product or component having a display function.

What are described above is related to the illustrative embodiments of the disclosure only and not limitative to the protecting scope of the present disclosure. The protecting scopes of the present disclosure are defined by the accompanying claims.

This application claims the benefit of priority from Chinese patent application No. 201510634079.8, filed on Sep. 29, 2015, the disclosure of which is incorporated herein in its entirety by reference as a part of the present application.

What is claimed is:

1. A support back plate comprising a first end and a second end at edges in opposition to each other, wherein the support back plate is bent into a shape of an arc face; and a thickness in the middle region of the support back plate is greater than that at the first end and the second end,
   wherein the support back plate comprises a main support back plate and at least one sub-support back plate, which is laminated on a raised side of the main support back plate, and an area of which is smaller than that of the main support back plate,
   two faces of the main support back plate and the sub-support back plate adjacent to the main support back plate that are in contact, a protrusion is provided on one of them, and a depression is provided on the other one, and the protrusion and the depression match with each other, so as to define the relative position between the main support back plate and the sub-support back plate adjacent to the main support back plate.

2. The support back plate according to claim 1, wherein the thickness of the support back plate is reduced in a stepwise manner from the middle region to the first end and the second end respectively.

3. The support back plate according to claim 1, wherein the support back plate comprises a plurality of sub-support back plates, areas of which are smaller than that of the main support back plate, and the sub-support back plates are sequentially laminated on the raised side of the main support back plate, and areas of the sub-support back plates decrease gradually in a direction away from the main support back plate.

4. The support back plate according to claim 3, wherein the main support back plate and the sub-support back plate adjacent to the main support back plate are bonded by an adhesive, and two adjacent sub-support back plates are bonded by an adhesive.

5. The support back plate according to claim 3, wherein two faces of the sub-support back plates that are in contact, a protrusion is provided on one of them, and a depression is provided on the other one, and the protrusion and the depression match with each other, so as to define the relative position between. the two adjacent sub-support back plates.

6. The support back plate according to claim 3, wherein a central line of the main support back plate coincides with a central line of each of the sub-support back plates.

7. The support back plate according to claim 3, wherein in a direction from a recessed side of the main support back plate to the raised side of the main support back plate, strength of material for sub-support back plates increases gradually.

8. The support back plate according to claim 1, wherein the thickness of the support back plate is reduced gradually from the middle region to the first end and the second end respectively.

9. The support back plate according to claim 8, wherein the support back plate is in an integral structure, both a raised side and a recessed side of the support back plate are of an arc face, and a curvature of the raised side is greater than that of the recessed side.

10. The support back plate according to claim 1, wherein a groove is provided on a recessed side of the support back plate.

11. The support back plate according to claim 10, wherein the first end and the second end are located at edges of the groove of the support back plate.

12. The support back plate according to claim 1, wherein a material of the support back plate comprises at least one of epoxy resin, glass fiber reinforced plastic, metal, polymer film, ceramic, or carbon fiber.

13. The support back plate according to claim 1, wherein the support back plate comprises a third end and a fourth end in opposition to each other, which are located at edges of the support back plate, the first end, the second end, the third end and the fourth end do not coincide with one another, and the thickness in the middle region of the support back plate is greater than that at the third end and at the fourth end.

14. The support back plate according to claim 13, wherein the third end and the fourth end are two opposite sides of the support back plate or two opposite points on edges of the support back plate.

15. The support back plate according to claim 1, wherein the first end and the second end are two opposite sides of the support back plate or two opposite points on edges of the support back plate.

16. A curved display device comprising the support back plate according to claim 1 and a display panel, wherein the display panel is disposed on a recessed side of the support back plate.

17. The curved display device according to claim 16, wherein the support back plate and the display panel is fixed together by adhering, inlaying, magnetic absorption, or vacuum absorption.

18. The curved display device according to claim 16, wherein a groove is provided on a recessed side of the support back plate, and the display panel is disposed in the groove.

\* \* \* \* \*